(12) United States Patent  
Lautzenhiser et al.

(10) Patent No.: US 6,747,517 B2
(45) Date of Patent: Jun. 8, 2004

(54) POWER-SHIFTING RF AMPLIFIERS (75) Inventors: Lloyd L. Lautzenhiser, Sun Valley, NV (US); Barry A. Lautzenhiser, Carson City, NV (US)

(73) Assignee: Emhiser Research, Inc., Verdi, NV (US)

( * ) Notice: Subject to any disclaimer, the term of this patent is extended or adjusted under 35 U.S.C. 154(b) by 5 days.

(21) Appl. No.: 10/177,572

(22) Filed: Jun. 21, 2002

(65) Prior Publication Data

US 2002/0180532 A1 Dec. 5, 2002

Related U.S. Application Data (63) Continuation-in-part of application No. 10/091,056, filed on Mar. 4, 2002, now Pat. No. 6,690,238, which is a continuation-in-part of application No. 10/028,844, filed on Dec. 20, 2001, now Pat. No. 6,683,499

(60) Provisional application No. 60/258,341, filed on Dec. 27, 2000.

(51) Int. Cl.$^7$ ................................................ H03F 3/68
(52) U.S. Cl. ...................... 330/295; 330/84; 330/286; 330/124 R
(58) Field of Search ........................... 330/295, 124 R, 330/84, 286; 332/103, 105; 375/308, 309

(56) References Cited

U.S. PATENT DOCUMENTS

| 4,549,152 A | 10/1985 | Kumar |
| 4,631,493 A | * 12/1986 | Vendelin et al. ............. 330/277 |
| 5,256,987 A | 10/1993 | Kibayashi et al. |
| 5,606,283 A | 2/1997 | Allen et al. |
| 5,949,287 A | 9/1999 | Kurusu et al. |
| 6,163,220 A | 12/2000 | Schellenberg |
| 6,469,581 B1 | * 10/2002 | Kobayashi .................. 330/295 |

OTHER PUBLICATIONS

Kevin W. Kobayashi, Matt Nishimoto, Liem T. Tran, Huei Wang, John C. Cowles, Thomas Ray Block, Jeffrey H. Elliott, Barry R. Allen, Aaron K. Oki, and Dwight C. Streit, A 44–GHz High IP3 InP–HBT Amplifier with Practical Current Reuse Biasing, IEEE Transactions on Microwave Theory and Techniques, Dec., 1998, pp. 2541–2551, vol. 46, No. 12, FIGURE 6 and p. 2544, col. 2, last paragraph to p. 2545, col. 1, first 14 lines.

* cited by examiner

Primary Examiner—Henry Choe
(74) Attorney, Agent, or Firm—Wendell E. Miller (57) ABSTRACT

Apparatus (70, 80, 90) and method are provided for selectively proportioning, or hot-switching, rf power to a plurality of rf outputs. The method includes: splitting a single rf signal into a plurality of split rf signals using power splitters (12, 36, 38A, 38B); separately power amplifying the split rf signals into the plurality of rf power outputs in solid-state current devices (Q1, Q2, Q3, Q4); selectively proportioning gains of the power amplifying steps; and maintaining a total rf power substantially constant during the selectively proportioning step. Preferably, the method includes series connecting the solid-state current devices (Q1, Q2, Q3, Q4) in series between a dc source-voltage ($V_{DC}$) and a lower dc voltage; and performing the separate amplifying steps in the series-connected solid-state current devices (Q1, Q2, Q3, Q4). The selective proportioning step includes adjusting gate voltages of the solid-state current devices (Q1, Q2, Q3).

44 Claims, 6 Drawing Sheets

POWER-SHIFTING RF AMPLIFIERS

CROSS-REFERENCES TO RELATED APPLICATIONS

The subject patent application is a Continuation-in-part of U.S. patent application Ser. No. 10/091,056 which was filed on Mar. 4, 2002 now U.S. Pat. No. 6,690,238; both the subject patent application and application Ser. No. 10/091,056 are Continuation-in-part applications of U.S. patent application Ser. No. 10/028,844 which was filed on Dec. 20, 2001 now U.S. Pat. No. 6,683,499; and application Ser. No. 10/028,844 claims priority to Provisional Patent Application No. 60/258,341 which was filed on Dec. 27, 2000.

STATEMENT RE FEDERALLY SPONSORED RESEARCH OR DEVELOPMENT

Not Applicable

REFERENCE TO SEQUENCE LISTING

Not Applicable

BACKGROUND OF THE INVENTION

1. Field of the Invention

The present invention relates generally to radio frequency (rf) or microwave rf power amplifiers. More particularly, the present invention pertains to rf power amplifiers in which field-effect devices are connected in series to proportionally divide a dc supply voltage, and in which both apparatus and method are provided for proportionally shifting or selectively switching rf power between/among a plurality of rf outputs and/or a plurality of antennas.

2. Description of the Related Art

Binary-phase-shift-key (BPSK) modulation is a form of digital modulation in which the rf carrier is phase shifted 180 degrees (inverted) as a digital input changes from 0 to 1. A demodulator, that is a part of an rf receiver, demodulates these phase inversions to recover the original digital stream. Commonly, demodulation is accomplished by a Costas Loop.

A common encoder consists of the rf carrier being inserted into an rf input port of a mixer while a digital input is inserted into an input port of a local oscillator. As the digital input into the input port of the local oscillator changes from an above ground voltage (1) to below ground (0), the output of the mixer changes phase from 0 degrees to 180 degrees.

If the input to the local oscillator were to change polarity (0 to 1, or 0) instantaneously, the phase of the rf output would also change polarity instantaneously. This would cause the output rf spectrum to spread to an unacceptable width.

To prevent this spread in the rf output spectrum (spectrum splatter), commonly, the input to the local oscillator port is filtered (usually with a Bessel filter). As a result, the rf output decreases as the voltage to the input port of the local oscillator is decreased, and the rf output decreases to zero when the input to the local oscillator passes through 0.0 volts. Then the rf output increases in amplitude (with inverted phase) as the voltage to the local oscillator input increases to the opposite extreme.

Therefore, as the filtered input passes through 0.0 volts as the polarity changes, the rf output also passes through a zero rf output condition. This creates a problem in that the rf power amplifier section stages of conventional transmitters consists of several stages biased to Class C. In a Class C amplifier, a zero rf input signal causes the amplifier to shut off. If a Class C amplifier were to follow the above-described encoder, it would shut off every time the input data changes state. This turning off and on of the Class C stages would cause the rf output to occupy far more of the frequency spectrum than allowed by federal regulations.

Lautzenhiser et al., in U.S. patent application Ser. No. 10/028,844, filed Dec. 20, 2001, solves the above-mentioned problems with phase-shifting in general, and binary-phase-shift-key (BPSK) modulation in particular, in that the rf output stays relatively constant as the phase shifts. In one embodiment the phase shifts up to 180 degrees generally linear with a variable phase-control voltage, or shifts 180 degrees in response to a filtered BPSK input.

More particularly, the phase shifts from 0 to 90 degrees in response to a phase-control voltage increasing from 0.0 volts dc to 5.0 volts dc during which time the rf output remains substantially constant; and the rf output continues to be relatively constant as the phase shifts from 90 to 180 degrees as the filtered BPSK input increases from 5.0 volts dc to 10.0 volts dc.

To phase shift the rf output to some angles the entire source-voltage is utilized by a selected one of the solid-state amplifying devices, or FETs, and to phase shift the rf output to other phase angles the source-voltage is dividingly shared, in selected proportions, by two adjacent ones of the solid-state amplifying devices.

Since the rf output remains substantially constant during changes in the phase angle, turning off and on of Class C stages following the encoder is avoided, frequency splatter is avoided, and the occupied frequency spectrum of the rf output follows theoretical values more closely.

In the present invention, in Lautzenhiser et al., application Ser. No. 10/028,844 which was filed on Dec. 20, 2001 and which is incorporated herein by reference thereto, and in Lautzenhiser et al., U.S. patent application Ser. No. 10/091,056 which was filed on Mar. 4, 2002 and which is incorporated herein by reference thereto, two or more solid-state amplifying devices, or FETs, are connected in series in a totem-pole arrangement, and dividingly share a dc source-voltage.

While all three of the above-identified patent applications dividingly share a dc source-voltage, they dividingly share the dc source-voltage for different purposes.

U.S. patent application Ser. No. 10/028,844, two or more solid-state devices, or FETs, are series connected, in a totem-pole arrangement, for the purpose of equally sharing a dc source-voltage that is too high for a single solid-state amplifying device, or FET.

In application Ser. No. 10/091,056, rather than dividing the dc source-voltage equally between/among a plurality of FETs, the dc source-voltage is divided in selected proportions between/among the FETs. And the purpose is different. The dc source-voltage is divided in selected proportions for the purpose of selectively shifting the phase of the rf output.

In the present patent application, similarly to application Ser. No. 10/091,056, the dc source-voltage is also divided in selected proportions between/among a plurality of FETs. But the purpose is different. In the present invention, the dc source-voltage is divided in selected proportions for the purpose of shifting any selected percentage of the rf output, or selectively switching the entire rf output, between/among a plurality of rf outputs or antennas.

Finally, in application Ser. No. 10/091,056 gains of the FETs are selectively controlled in a manner that preferably results in progressive, and generally linear, phase shifting in response to a control input. In contrast, in the present invention, gains of the FETs are controlled in response to a control input to shift selected proportions of the total rf output, or switch the total rf output, between/among a plurality of rf outputs in accordance with any selected pattern and rate, and in accordance with any selected time frame.

However, all three inventions share a common problem. Unless proper rf decoupling is achieved, the maximum rf power output is extremely limited and/or reliability and component life are seriously endangered.

More particularly, totem-pole arrangement of solid-state amplifying devices was taught in a paper published in *IEEE Transactions on Microwave Theory and Techniques,* Volume 46, Number 12, of December 1998, in an article entitled, *"A 44-Ghz High IP3 InP-HBT Amplifier with Practical Current Reuse Biasing."* As taught in the IEEE article, in totem pole circuits two, or more, solid-state amplifying devices are used in series for dc operation, but they are used in parallel for rf operation, thereby supposedly solving the disparity between source-voltages and working voltages.

However, totem pole, voltage-dividing, or current-sharing circuits, have been used only at low rf powers, as in the above-referenced article wherein the power was in the order of 10.0 milliwatts. At higher rf powers, inadequate rf decoupling has resulted in low power efficiency, oscillation, a decrease in reliability of the circuits, and destruction of the solid-state amplifying devices.

In contrast to the extremely low rf outputs in which the prior art has been able to utilize totem pole circuitry, Lautzenhiser et al., in the aforementioned patent applications, teach apparatus and method for rf decoupling in which the principles thereof may be used to make totem pole circuits that are limited only by power limitations of the solid-state amplifying devices that are used in the totem pole.

In totem pole circuits, problems with rf decoupling are most severe between the solid-state amplifying devices. For instance, when using FETs, rf decoupling is the most critical with regard to a source terminal of any FET that is connected to a drain terminal of a next-lower FET. Capacitors and rf chokes are used for rf decoupling and rf isolating, but selection and design of capacitor decoupling is the most critical.

The next most critical location for rf decoupling is the source terminal of the lower FET when the source terminal of the lower FET is connected to an electrical ground through a resistor, as shown herein. However, if a negative bias voltage is used for the gate of the lower FET, and the source is connected directly to an electrical ground, this source terminal is already rf decoupled.

Other critical rf decoupling problems are those associated with the source-voltage to the drain of the upper FET and bias voltages to the gates of the FETs. The use of properly designed rf chokes are sufficient to provide adequate rf decoupling in these locations.

Unless rf decoupling is provided as taught herein, reduced efficiency will certainly occur, and both instability and destruction of the solid-state amplifying devices are likely. This is true for the totem-pole circuitry taught by Lautzenhiser et al. in application Ser. No. 10/028,844 in which a source-voltage that is excessive for a single solid-state amplifying device is dividingly shared, for phase-shifting rf amplifiers taught by Lautzenhiser et al. in U.S. patent application Ser. No. 10/091,056, and for power-shifting rf amplifiers taught herein.

BRIEF SUMMARY OF THE INVENTION

The present invention provides apparatus and method for selectively proportioning rf power to a plurality of rf outputs or antennas. The method includes splitting a single rf signal into a plurality of split rf signals; separately power amplifying the split rf signals into the plurality of rf power outputs; selectively proportioning gains of the power amplifying steps; and maintaining a summation of the gains substantially constant.

The apparatus and method of the present invention also provides apparatus and means for selectively switching rf power from one rf output, or one antenna, to an other rf output or antenna. Whether selectively proportioning or switching, by maintaining the gains of the amplifying steps substantially constant, the rf power is maintained substantially constant during either the selective proportioning step or the switching step.

Preferably, the method of the present invention includes series connecting a plurality of solid-state current devices, which preferably are FETs, between a dc supply voltage and a lower dc voltage; splitting an rf input signal into the plurality of split rf signals; separately power amplifying the split rf signals in the series-connected solid-state current devices into the plurality of power outputs; selectively proportioning gains of the separate amplifying steps; and maintaining a total rf power substantially constant during the selective proportioning step.

The apparatus and method of the present invention may be used as a solid-state switch for selectively connecting an rf signal to a primary rf power amplifier and a redundant rf power amplifier, thereby providing for continuing rf power when the primary rf power amplifier fails.

The apparatus and method of the present invention may be used to selectively proportion rf power outputs, or to selectively shift rf power outputs, between top and belly-mounted antennas of an airplane, and may be used to selectively proportion rf power, at zero or quadrature phase angles, among antennas in an array.

Depending upon the type of splitters that are used, the selectively proportioned rf outputs may be in-phase or at angles such as 0, 45, 90, and 270 degrees. One preferred type of splitter is a Wilkenson splitter.

Finally, as taught herein, as taught by Lautzenhiser et al. in application Ser. No. 10/091,056, and as taught by Lautzenhiser et al. in application Ser. No. 10/028,844, a mounting technique is provided for FETs that avoids both over heating and the resultant danger of destroying the internal junctions of the solid-state amplifying device, while maintaining electrical isolation from a circuit ground, in circuits wherein the source terminal of a FET is the mounting flange of the packaged FET.

In a first aspect of the present invention, a method for selectively proportioning rf power to a plurality of rf outputs comprises: splitting a single rf signal into a plurality of split rf signals; separately power amplifying the split rf signals into the plurality of rf power outputs; selectively proportioning gains of the power amplifying steps; and maintaining a summation of the gains substantially constant.

In a second aspect of the present invention, a method for selectively proportioning rf power to a plurality of rf outputs comprises: series connecting a plurality of solid-state current devices between a dc supply voltage and a lower dc voltage; splitting an rf input signal into a plurality of split rf signals; separately power amplifying the split rf signals in the series-connected solid-state current devices into a plurality of power outputs; selectively proportioning gains of the separate amplifying steps; and maintaining a total rf power substantially constant during the selective proportioning step.

In a third aspect of the present invention, a method for selectively proportioning rf power to a plurality of antennas on an airplane comprises: splitting a single rf signal into a plurality of split rf signals; separately power amplifying the split rf signals into a plurality of rf power outputs; separately connecting the rf power outputs to respective ones of the antennas; selectively proportioning gains of the power amplifying steps; and maintaining rf power substantially constant during the selectively proportioning step.

In a fourth aspect of the present invention, a method for selectively proportioning rf power among an array of antennas comprises: splitting a single rf signal into a plurality of split rf signals; separately power amplifying the split rf signals into a plurality of rf power outputs; separately connecting the rf power outputs to the antennas; selectively proportioning gains of the power amplifying steps; and maintaining rf power substantially constant during the selectively proportioning step.

In a fifth aspect of the present invention, a method for rf power amplifying comprises: series connecting upper and lower solid-state current devices between a dc supply voltage and a lower dc voltage; separately amplifying rf signals in the solid-state current devices with an rf output of the upper solid-state current device exceeding about 100 milliwatts; and making an rf effective series resistance between the series connection of the solid-state current devices and an electrical ground less than 0.4 divided by the rf output in watts.

In a sixth aspect of the present invention, a method for phase-shifting an rf output comprises: splitting an rf input into first and second rf signals that are at different phase angles; inputting the first rf signal into a first solid-state amplifying device; inputting the second rf signal into a second solid-state amplifying device; amplifying a selected one of the rf signals; and combining the rf signals subsequent to the amplifying step.

In a seventh aspect of the present invention, a method for phase-shifting an rf output comprises: splitting an rf input into first and second rf signals that are at different phase angles; inputting the first rf signal into a first solid-state amplifying device; inputting the second rf signal into a second solid-state amplifying device; proportionally amplifying the rf signals; and combining the rf signals subsequent to the amplifying step.

In an eighth aspect of the present invention, a method for binary-phase-shift-key modulating comprises: splitting an rf output into 0, 90, and 180 degree rf signals; separately amplifying the rf signals; combining the separately amplified rf signals into a single rf output; and preventing the single rf output from decreasing to zero when the rf output is shifted 180 degrees.

DETAILED DESCRIPTION OF THE INVENTION

Figure 1:
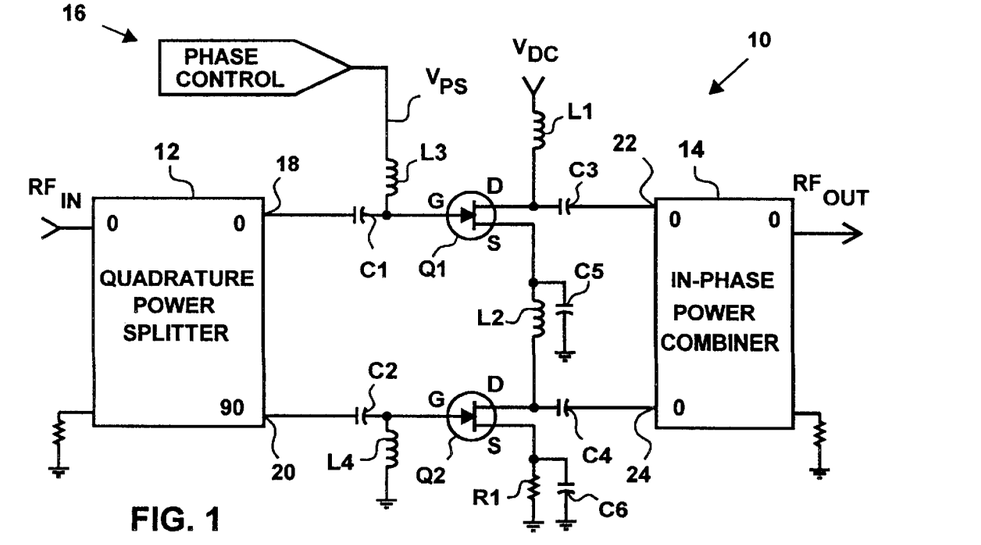
FIG. 1 is a variable phase-shifting rf amplifier in which two, n-channel, gallium arsenide FETs are stacked to selectively utilize a dc source-voltage, and in which an rf output can be shifted up to 90 degrees proportional to, and substantially linearly with, a single phase-control voltage.

Referring now to FIG. 1, a variable phase-shifting rf amplifier 10 includes solid-state amplifying devices, field-effect transistors, or FETs, Q1 and Q2 that are connected in series between a higher-voltage, or a dc source-voltage $V_{DC}$, and a lower voltage or an electrical ground for dc operation. That is, a first rf choke L1 connects the dc source-voltage $V_{DC}$ to a drain terminal of the FET Q1, a second rf choke L2 connects a source terminal of the FET Q1 to a drain terminal of the FET Q2, and a resistor R1 connects a source terminal of the FET Q2 to an electrical ground.

The variable phase-shifting rf amplifier 10 also includes a quadrature rf power splitter 12 and an in-phase rf power combiner 14. The quadrature rf power splitter 12 is connected to gate terminals of the FETs Q1 and Q2, respectively, by coupling capacitors C1 and C2. The rf power combiner 14 is connected to drain terminals of the FETs Q1 and Q2, respectively, by coupling capacitors C3 and C4. And source terminals of the FETs Q1 and Q2 are connected to an rf ground by decoupling capacitors C5 and C6, respectively.

A phase control 16 provides a phase-shifting voltage, $V_{PS}$, and supplies the phase-shifting voltage $V_{PS}$ to the gate terminal of the FET Q1 through a third rf choke L3 as a variable bias voltage. The resistor R1 supplies a negative gate-to-source bias for the gate terminal of the FET Q2 through a fourth rf choke L4. The resistor R1, in setting the gate-to-source bias for the FET Q2, controls current flow through the FETs, Q1 and Q2, thereby controlling rf power amplification of the variable phase-shifting rf amplifier 10.

Alternately, as taught by Lautzenhiser et al. in application Ser. No. 10/028,844, which is incorporated herein by reference thereto, an other solid-state device, such as an npn transistor, can be used to control rf power amplification in totem pole circuits such as the phase-shifting rf power 10 of FIG. 1.

In operation, an rf input signal $RF_{IN}$ of the variable phase-shifting rf amplifier 10 is split in the rf power splitter 12, selectively amplified in the FET Q1 and/or in the FET Q2, and combined in the rf power combiner 14 to provide a power amplified output at an rf output $RF_{OUT}$ that is selectively phase shifted.

The amplifying function of the FETs Q1 and Q2 is maintained by using rf chokes L1, L2, L3, and L4, to keep the rf signal from coupling onto the dc bias lines and to prevent rf interference between FETs Q1 and Q2; and decoupling capacitors, C5 and C6, are used to keep the source terminals of both FETs, Q1 and Q2, at an rf ground.

As taught by Lautzenhiser et al. in the aforementioned patent applications, the performance of rf amplifiers that use series connected FETs, or other solid-state amplifying devices, rests heavily on correct design and application of rf chokes, such as the rf chokes L1, L2, L3, and L4 of FIG. 1, and decoupling capacitors, such as the decoupling capacitors C5 and C6 of FIG. 1. Therefore, rf choke and decoupling capacitor design will be considered in greater detail after considering various other embodiments of the present invention.

The voltage to the drain terminal D of the upper FET Q1 cannot exceed the specified FET drain-to-source voltage (Vds). Or, if the FET Q1 were replaced by a bipolar transistor, not shown, the collector-to-emitter voltage (Vce) could not exceed specifications. Therefore, in the case of GaAsFETs the source-voltage should be 12.0 volts dc (Vds+ Vquiescent of the lower FET Q2).

In operation, if the phase-shifting voltage, $V_{PS}$ is lowered to 0.0 volts dc by the phase control 16, 10.0 volts dc will be applied across the FET Q1, and 0.0 volts dc will be applied across the FET Q2. Since the gain of FETs, such as the FETs Q1 and Q2, is approximately a linear function of the drain-to-source voltage, an rf output of the FET Q1 will be at maximum gain while an rf output of the FET Q2 will be at minimum gain.

At this time, the in-phase rf power combiner 14 will output half of the rf power to the rf output $RF_{OUT}$ and half of the rf power to the internal or external load. More importantly, the half delivered to the rf output $RF_{OUT}$ will be in-phase with a first rf signal at an upper rf output terminal 18 of the quadrature rf power splitter 12, that is disregarding inversion of the FET Q1.

If the phase-shifting voltage $V_{PS}$ is now raised to 10.0 volts dc by the phase control 16, 0.0 volts dc will be applied across the FET Q1, and 10.0 volts dc will be applied across the FET Q2. The FET Q1 will now be at a minimum gain while the FET Q2 will be at maximum gain. In this case, the output of the in-phase rf power combiner 14 will be in-phase with a second rf signal at a lower rf output terminal 20 of the quadrature power splitter 12. That is, the phase will have been shifted 90 degrees. Again, half of the power is delivered to the rf output $RF_{OUT}$ and half is delivered to the internal or external load.

If the phase-shifting voltage $V_{PS}$ is set to 5.0 volts dc by the phase control 16, 5.0 volts dc will be applied across both the FET Q1 and the FET Q2, and both FETs Q1 and Q2 will operate at half gain. In this case, an upper rf input terminal 22 and a lower rf input terminal 24 to the in-phase rf power combiner 14 will be equal in amplitude but 90 degrees out of phase.

At this time, the rf output $RF_{OUT}$ of the in-phase rf power combiner 14 remains at half power but is 45 degrees out of phase with the upper rf input terminal 22. As before, half of the power will be delivered to the internal or external load.

Thus, it can be seen that the phase control 16 is effective to shift the phase of the variable phase-shifting rf amplifier 10 monotonically, and with reasonable linearly, from 0 to 90 degrees as the phase-shifting voltage $V_{PS}$ is varied from 0.0 volts dc to 10.0 volts dc.

Finally with regard to FIG. 1, alternately, instead of the quadrature rf power splitter 12 and the in-phase rf power combiner 14 being used, an in-phase rf splitter and a quadrature rf combiner may be used.

Figure 2:
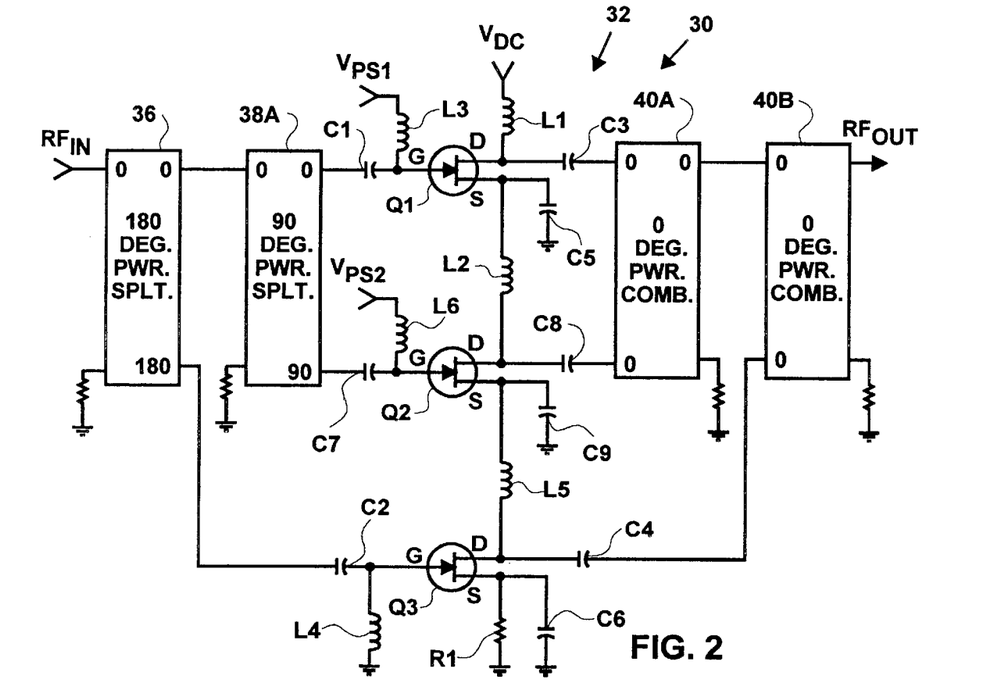
FIG. 2 is a phase splitting/combining rf amplifier, in which three FETs are stacked to selectively utilize a dc source-voltage, that when combined with a phase control of FIG. 3, becomes a variable phase-shifting rf amplifier in which a phase angle of an rf output can be shifted up to 180 degrees in response to two phase-shifting voltages.
Figure 3:
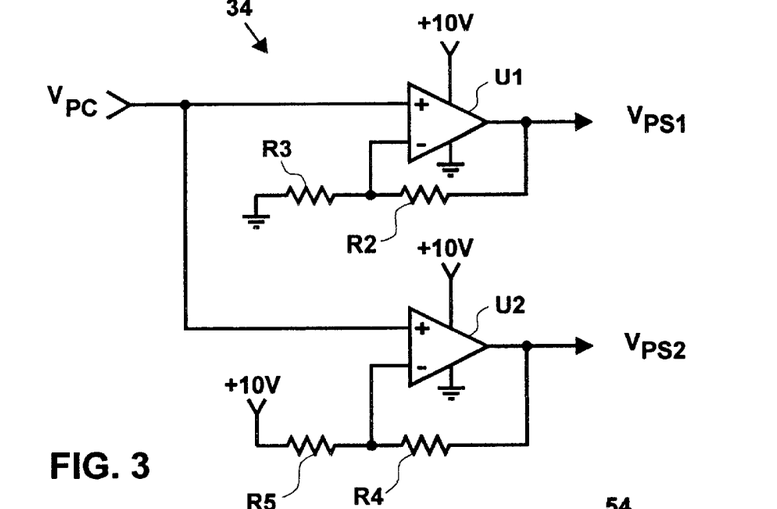
FIG. 3 is a phase control, that generates two phase-shifting voltages in response to a variable phase-control voltage, and that when combined with the phase splitter/combiner rf amplifier of FIG. 2, becomes a variable phase-shifting rf amplifier in which the rf output can be phase shifted up to 180 degrees substantially linear with the phase-control voltage.

Referring now to FIGS. 2 and 3, a variable phase-shifting rf amplifier 30 includes both a phase splitting/combining rf amplifier 32 of FIG. 2 and a phase control 34 of FIG. 3. The phase control 34 generates phase-shifting voltages $V_{PS1}$ and $V_{PS2}$. The rf output $RF_{OUT}$ is shifted up to 180 degrees in response to the phase-shifting voltages $V_{PS1}$ and $V_{PS2}$. This is twice the phase shifting range of the variable phase-shifting rf amplifier 10 of FIG. 1.

The phase splitting/combining rf amplifier 32 of FIG. 2 includes a 180 degree power splitter 36, a 90 degree power splitter 38A, solid-state amplifying devices, field-effect transistors, or FETs, Q1, Q2, and Q3, and 0 degree power combiners, 40A and 40B.

Also, the phase splitting/combining rf amplifier 32 includes coupling capacitors C1, C2, C3, and C4, decoupling capacitors C5 and C6, rf chokes L1, L2, L3, and L4, and the resistor R1 as shown in FIG. 1. In addition, the phase splitting/combining rf amplifier 32 includes coupling capacitors C7 and C8, a decoupling capacitor C9, and rf chokes L5 and L6.

If phase-shifting voltages, $V_{PS1}$ and $V_{PS2}$ are at 0.0 volts dc, 10.0 volts dc will be applied across the FET Q1 and 0.0 volts dc will be applied across the FETs Q2 and Q3. At this time, since the gain of the FETs Q1, Q2, and Q3 is approximately a linear function of the applied voltage from drain to source, the FET Q1 will be at maximum gain while the FETs Q2 and Q3 will be at minimum gain, and the rf output $RF_{OUT}$ will be at zero degrees relative to the rf input signal $RF_{IN}$, that is disregarding inversion of the FET Q1.

If the phase-shifting voltage $V_{PS1}$ is raised to 10.0 volts dc, and the phase-shifting voltage $V_{PS2}$ remains at 0.0 volts dc, 10.0 volts dc will be applied across the FET Q2, and 0.0 volts dc will be applied across the FETs Q1 and Q3. The FET Q2 will now be at maximum gain while the FETs Q1 and Q3 will be at minimum gain. In this case, the rf output $RF_{OUT}$ will be at 90 degrees relative to the rf input signal $RF_{IN}$. Again, this disregards inversion of the FET Q2.

Similarly to FIG. 1, if the phase-shifting voltage $V_{PS1}$ is 5.0 volts dc, and the phase-shifting voltage $V_{PS2}$ is at 0.0 volts dc, the rf output $RF_{OUT}$ will be at 45 degrees relative to the rf input signal $RF_{IN}$. By proper application of the phase-shifting voltages, $V_{PS1}$ and $V_{PS2}$, the phase angle of the variable phase-shifting rf amplifier 30 can be made to vary monotonically and reasonably linearly from 0 to 180 degrees.

As noted above, the variable phase-shifting rf amplifier 30 includes both the phase splitting/combining rf amplifier 32 of FIG. 2 and the phase control 34 of FIG. 3. The phase control 34 generates phase-shifting voltages, $V_{PS1}$, and $V_{PS2}$ for use by the phase splitting/combining rf amplifier 32. These phase-shifting voltages, $V_{PS1}$, and $V_{PS2}$, are generated in response to a control voltage $V_{PC}$ that is adjustable.

The phase control 34 of FIG. 3 includes amplifiers U1 and U2 which are rail-to-rail operational amplifiers. In addition, the phase control 34 includes resistors R2, R3, R4, and R5 that set the gain of the amplifiers, U1 and U2, and that set the voltage at which the amplifier U2 starts amplifying.

The amplifier U1 is biased to start amplifying at the phase-control voltage $V_{PC}$ of 0.0 volts, and the amplifier U2 is biased to start amplifying at the phase-control voltage $V_{PC}$ of 5.0 volts. In the schematic shown in FIG. 3, the resistors R2, R3, R4, and R5 all have the same resistances, which, for instance, may have resistances of 10 K ohms.

In response to the phase-control voltage $V_{PC}$ of 0.0 volts, the phase control 34 produces phase-shifting voltages $V_{PS1}$ and $V_{PS2}$ of 0.0 volts, dc. In response to increases in the phase-control voltage $V_{PC}$, the phase-shifting voltage $V_{PS1}$ increases to 5.0 volts while keeping the phase-shifting voltage $V_{PS2}$ at 0.0 volts dc. Phase-control voltages $V_{PC}$ of 0.0, 2.5, 5.0, 7.5, and 10.0 volts produce phase angles of 0, 45, 90, 135, and 180 degrees, respectively.

With further increases in the phase-control voltage $V_{PC}$, when the phase-shifting voltage $V_{PS1}$, reaches 10.0 volts dc, it remains at this level while the phase-shifting voltage $V_{PS2}$ increases from 0.0 volts to 10.0 volts dc.

Thus, it can be seen that by combining the phase control 34 with the phase splitting/combining rf amplifier 32, the resultant variable phase-shifting rf amplifier 30 can be phase shifted monotonically and reasonably linearly from 0 to 180 degrees as the phase-control voltage $V_{PC}$ is increased.

Figure 4:
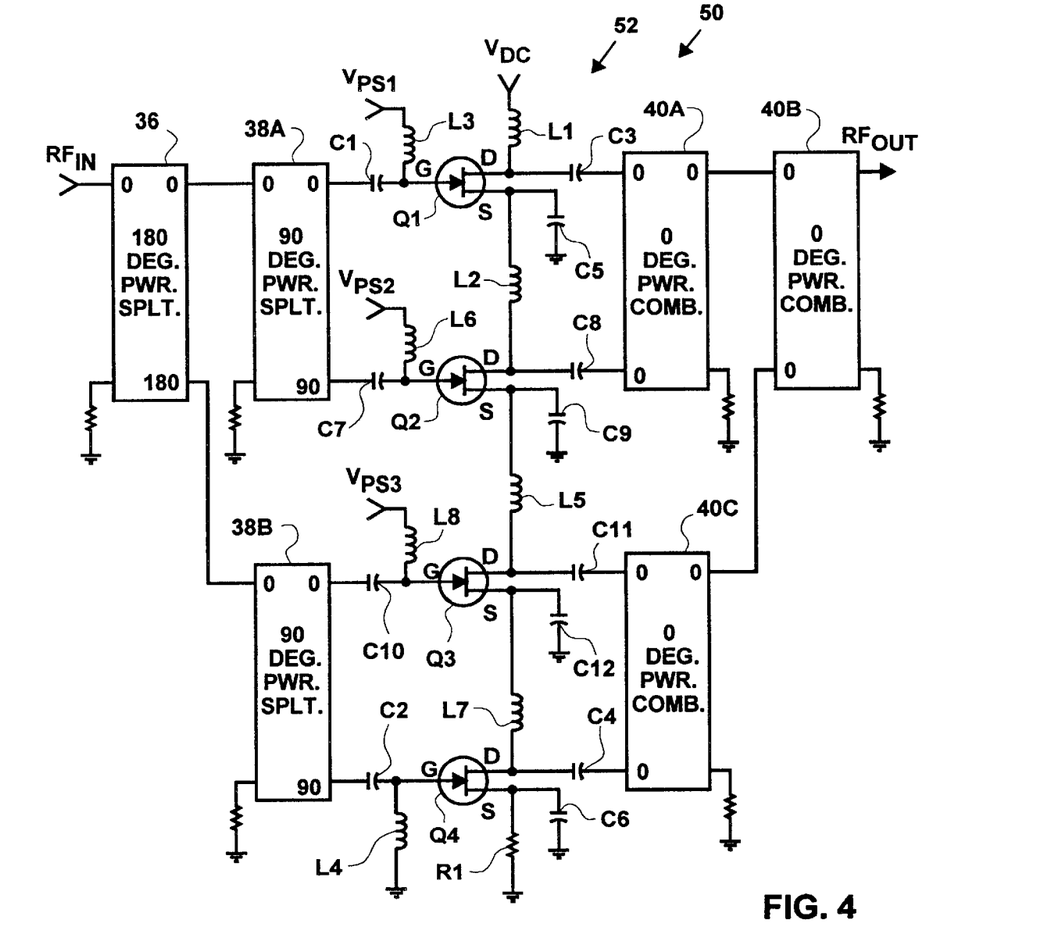
FIG. 4 is a phase splitting/combining rf amplifier, in which four FETs are stacked to selectively utilize a source-voltage, that when combined with a phase control of FIG. 5, becomes a variable phase-shifting rf amplifier in which a phase angle of an rf output can be shifted up to 270 degrees in response to three phase-shifting voltages.
Figure 5:
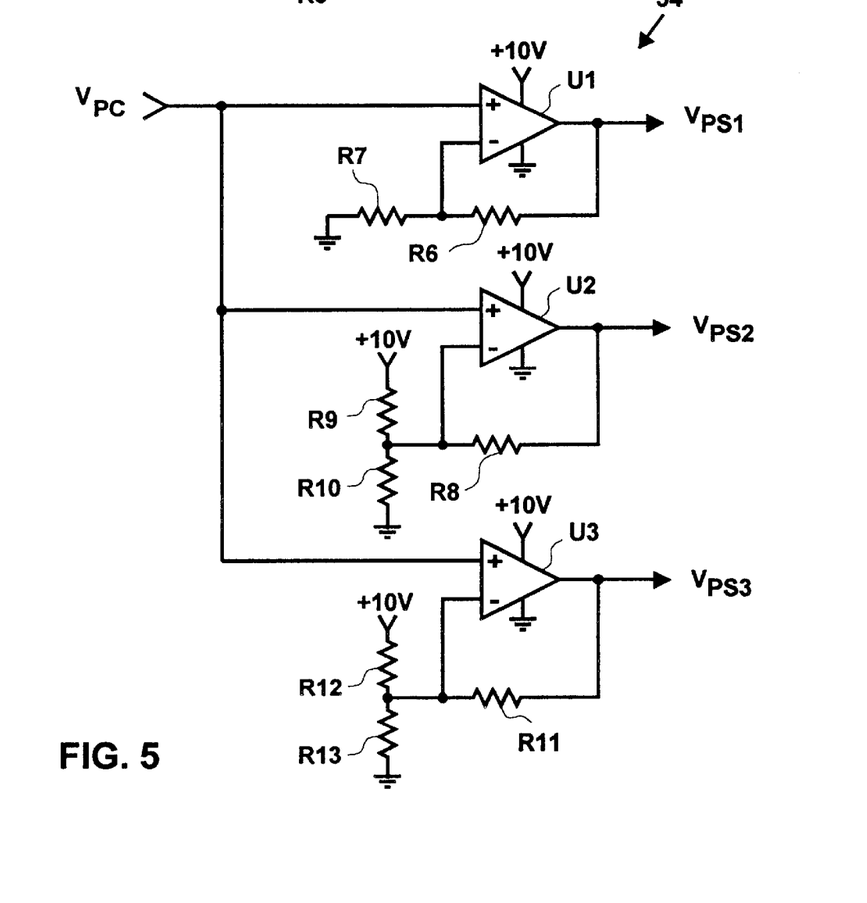
FIG. 5 is a phase control that generates three phase-shifting voltages in response to a single phase-control voltage, and that when combined with the phase splitter/combiner rf amplifier of FIG. 4, becomes a variable phase-shifting rf amplifier in which the rf output can be phase shifted up to 270 degrees substantially linear with a single phase-control voltage.

Referring now to FIGS. 4 and 5, a variable phase-shifting rf amplifier 50 of FIG. 4 includes both a phase splitting/combining rf amplifier 52 of FIG. 4 that requires phase-shifting voltages $V_{PS1}$ $V_{PS2}$, and $V_{PS3}$ and a phase control 54 of FIG. 5. The phase control 54 generates the phase-shifting voltages $V_{PS1}$, $V_{PS2}$, and $V_{PS3}$ in response to the adjustable or selectible phase-control voltage $V_{PC}$. The variable phase-shifting rf amplifier 50 has a phase-shift range of 270 degrees, as opposed to 180 degrees for the variable phase-shifting rf amplifier 30 of FIGS. 2 and 3.

The phase-splitting/combining rf amplifier 52 includes the 180 degree power splitter 36, the 90 degree power splitter 38A, a 90 degree power splitter 38B, four solid-state amplifying devices, field-effect transistors, or FETs, Q1, Q2, Q3, and Q4, the 0 degree power combiners 40A and 40B, and an other 0 degree power combiner 40C.

The phase splitting/combining rf amplifier 52 further includes coupling capacitors, decoupling capacitors, and rf chokes as shown in FIGS. 1 and 2, and as named in conjunction therewith. In addition, the phase-splitting/combining rf amplifier 52 includes coupling capacitors C10 and C 11, decoupling capacitor C12, and rf chokes L7 and L8.

If phase-shifting voltages $V_{PS1}$, $V_{PS2}$, and $V_{PS3}$, are all at 0.0 volts dc, 10.0 volts dc will be applied across the FET Q1 and 0.0 volts dc will be applied across the FETs Q2, Q3, and Q4. Since the gain of the FETs, Q1, Q2, Q3, and Q4 is approximately a linear function of the applied voltage from drain to source, the FET Q1 will be at maximum gain while the FETs Q2, Q3, and Q4 will be at minimum gain. The rf output ($RF_{OUT}$) will then be at zero degrees relative to the rf input signal ($RF_{IN}$), that is disregarding inversion of the FET Q1.

If the phase-shifting voltage $V_{PS1}$ is now raised to 10.0 volts dc and the phase-shifting voltages $V_{PS2}$ and $V_{PS3}$ remain at 0.0 volts dc, 10.0 volts dc will be applied across the FET Q2, and 0.0 volts dc will be applied across the FETs Q1, Q3, and Q4. The FET Q2 will now be at maximum gain while the FETs Q1, Q3, and Q4 will be at minimum gain. In this case, the rf output ($RF_{OUT}$) will be at 90 degrees relative to the rf input signal ($RF_{IN}$), again disregarding inversion of the FET Q2.

Similarly to FIG. 1, if the phase-shifting voltage $V_{PS1}$ is at 5.0 volts dc, and the phase-shifting voltages $V_{PS2}$ and $V_{PS3}$ are at 0.0 volts dc, the rf output ($RF_{OUT}$) will be at 45 degrees relative to the rf input signal ($RF_{IN}$). By proper application of the phase-shifting voltages $V_{PS1}$, $V_{PS2}$, and $V_{PS3}$, the phase of the phase-shifting rf amplifier 50 can be made to vary monotonically and reasonably linearly from 0 degrees to 270 degrees.

As noted above, the variable phase-shifting rf amplifier 50 includes both the phase splitting/combining rf amplifier 52 of FIG. 4 and the phase control 54 of FIG. 5. The phase control 54 generates phase-shifting voltages $V_{PS1}$, $V_{PS2}$, and $V_{PS3}$ for use by the phase splitting/combining rf amplifier 52 in response to the phase-control voltage $V_{PC}$ that is adjustable.

The phase control 54 of FIG. 5 includes amplifiers U1, U2, and U3 which are rail-to-rail operational amplifiers. In addition, the phase control 54 includes resistors R6, R7, R8, R9, R10, R11, R12, and R13 that set the gain of the amplifiers, U1, U2, and U3, to be 4.0. Resistances of the resistors R6, R7, R8, R9, R10, R11, R12, and R13, preferably are 30K, 10K, 30K, 30K, 15K, 30K, 15K and 30K, respectively, but all may be at resistances that are any reasonable multiple or fraction thereof.

The amplifiers, U1, U2, and U3, are biased to start amplifying at different phase-control voltages $V_{PC}$ of 0.0, 2.5, 5.0, and 7.5 volts by resistances as listed above, so that the phase-control voltages $V_{PC}$ of 0.0, 2.5, 5.0, 7.5, and 10.0 volts produce phase angles of 0, 45, 90, 135, and 180 degrees, respectively.

More particularly, in response to the phase-control voltage $V_{PC}$ of 0.0 volts, the phase control 54 produces phase-shifting voltages, $V_{PS1}$, $V_{PS2}$, and $V_{PS3}$, of 0.0 volts, dc. In response to increases in the phase-control voltage $V_{PC}$, the phase-shifting voltage $V_{PS1}$, increases to 10.0 volts while keeping the phase-shifting voltage $V_{PS2}$ at 0.0 volts dc.

With further increases in the phase-control voltage $V_{PC}$, when the phase-shifting voltage $V_{PS1}$ reaches 10.0 volts dc, it remains at this level while the phase-shifting voltage $V_{PS2}$ increases from 0.0 volts to 10.0 volts dc. In like manner, after the phase-shifting voltages, $V_{PS1}$, and $V_{PS2}$ both reach 10.0 volts dc, they remain at 10.0 volts dc while additional increases in the phase-control voltage $V_{PC}$ increase the phase-shifting voltage $V_{PS3}$ from 0.0 to 10.0 volts dc.

Thus, combining the phase splitting/combining rf amplifier 52 with the phase control 54 provides the variable phase-shifting rf amplifier 50 in which the rf output $RF_{OUT}$ can be phase shifted monotonically and reasonably linearly from 0 to 270 degrees as the phase-control voltage $V_{PC}$ is increased.

Referring now to FIGS. 1, 2, 4, 10, 11, 13, and 15, as stated previously, the amplification function of the FETs that are connected in a totem pole arrangement, such as the FETs Q1 and Q2, is maintained by using rf chokes, such as the rf chokes L1, L2, L3, and L4, to keep the rf signal from getting onto the dc bias lines and to prevent rf interference between the series-connected FETs; and decoupling capacitors, such as the decoupling capacitors C5 and C6, are used to keep the sources of FETs at an rf ground.

The selection of the decoupling capacitors and rf chokes are both critical to the rf performance of the circuits, particularly for high-power rf amplifiers, although selection of decoupling capacitors is the most critical. Decoupling capacitors, such as the decoupling capacitors C5, C6, C9, and C12 are selected for both resonant frequencies at or very near to the circuit operating frequency and the lowest possible effective (or equivalent) series resistances (ESRs).

The rf chokes, such as the rf chokes L1, L2, L3, L4, L5, L6, L7, and L8 preferably are inductors with self-resonant frequencies at or very near to the circuit operating frequency.

Figure 6:
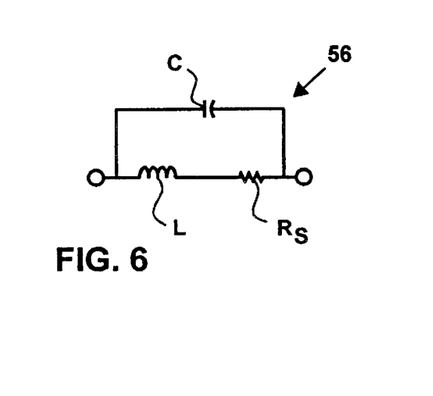
FIG. 6 is a model for simulating a microwave inductor.

Referring now to FIG. 6, a microwave circuit model 56 of an inductor is a series resistor $R_S$ and an inductor L in parallel with a capacitor C. The resistor $R_S$ represents the dc coil resistance along with the increased wire resistance at rf frequencies due to the skin effect (the effect of the current being concentrated nearer to the surface of the wire) as the operational frequency is increased. The capacitor C represents the distributed capacitance between the parallel windings of the coils. Inductance of the inductor L is the nominal component inductance.

At operation below the self-resonant frequency, the impedance of an inductor increases as frequency increases. At the inductor self-resonant frequency, the inductor, as represented by a parallel L/C circuit of FIG. 6, resonates as an open circuit creating a maximum impedance to the rf signal. At operation higher than the self-resonant frequency, the distributed capacitance of the capacitor C dominates the rf impedance resulting in the impedance decreasing with increasing frequency. The equation for self-resonant frequency of an inductor is: $F_{SR}=1/[2\pi^*\sqrt{(LC)}]$.

The resistance of the series resistor $R_S$ limits the maximum impedance of the self-resonant inductor. That is, the quality factor (Q) of the inductor is the ratio of an inductor's reactance to its series resistance. High-Q inductors, with very low resistances, have very high self-resonant impedances, but for only a narrow bandwidth. Lower-Q inductors, with higher resistances, have lower self-resonant impedances for a much broader bandwidth.

This self-resonant feature is used in the circuit to prevent the rf signal from coupling onto the dc bias lines and to aide the decoupling capacitors in preventing rf crosstalk between the two, or more, FETs. For narrow-band operation, very high-Q inductors are desired to maximize series impedance. Quarter wave transformers may also be used for this function in narrow-band applications. For broad-band operation, lower-Q inductors are desired to obtain a high impedance across a larger bandwidth. In either application, the inductor must be capable of passing the maximum dc current without breakdown.

Utilizing the self-resonant characteristics of decoupling capacitors, such as the decoupling capacitors C5, C6, C9, and C12, is required to optimize rf performance while maximizing dc-rf conversion efficiency, particularly in applications where the rf power exceeds 100 milliwatts.

Figure 7:
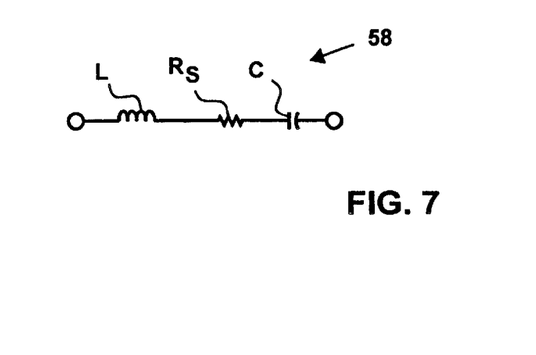
FIG. 7 is model for simulating a microwave capacitor.

Referring now to FIG. 7, a microwave circuit model 58 of a capacitor is an inductor L in series with a resistor $R_S$ in series with a capacitor C. The inductor L represents the inductance of the leads and the capacitor plates. The resistor $R_S$ represents the equivalent series resistance, or ESR, of the capacitor. Capacitor dielectric losses, metal plate losses, and skin effects all contribute to the ESR. The capacitor C is the nominal component capacitance.

These parasitic effects of a capacitor at microwave frequencies alter its impedance characteristics in the opposite manner as that of an inductor. At operation below the self-resonant frequency, a capacitor decreases in impedance as frequency increases. At the capacitor self-resonant frequency, a capacitor, as represented by a series L/C circuit of FIG. 7, resonates as a short circuit creating a minimum impedance to the rf signal. At frequencies higher than the self-resonant frequency, the lead and plate inductance of the inductor L dominates the rf impedance resulting in the impedance increasing with increasing frequency. The capacitor self-resonant frequency equation is: $F_{SR}=1/[2\pi^*\sqrt{(LC)}]$, which is the same as for the inductor.

The rf impedance of a capacitor at self-resonant frequency is equal to the ESR. As in the case of the inductor L, Q of a capacitor is the ratio of a capacitor's reactance to its ESR, or alternatively Q is 1/DF where DF is the dissipation factor of the capacitor. High-Q capacitors, with very low ESR, have very low self-resonant impedances, but for only a narrow bandwidth. Lower-Q capacitors, with higher ESR, have lower self-resonant impedances for a much broader bandwidth. Presently, the preferred capacitor dielectric to minimize capacitor ESR is porcelain. Porcelain has a dissipation factor (DF) of 0.00007, the lowest of all currently available capacitor dielectrics.

To minimize the rf impedance from the FET source terminal to a circuit ground, decoupling capacitors with self-resonant frequencies at or very near to the amplifier operational frequency are required in higher rf power applications.

The power dissipated in the decoupling capacitor is $P_{DISS}=I^2*ESR$, where I is the root-mean-square, or rms, of the rf current through the capacitor. Alternatively, $P_{DISS}=P_{RF}*ESR/Z$ where Z is the circuit load impedance, typically 50 ohms, and $P_{RF}$ is the rf output power of the FET.

For optimal performance, the ratio of FET rf output power $P_{RF}$, to decoupling capacitor power dissipated $P_{DISS}$, should be no less than 2000 for medium rf power, which is defined as 100 milliwatts to 2.0 Watts FET rf output power. For high-power rf applications, which is defined as FET output power greater than 2.0 Watts, the $P_{RF}/P_{DISS}$ ratio should be no less than 5000.

Very high-Q decoupling capacitors are necessary to minimize series impedance to a circuit ground, whether it be for narrow-band, or wide-band operation. For broad-band operation, multiple high-Q decoupling capacitors with self-resonant frequencies selected at several points in the operating frequency band are optimally selected for minimum ESR across a broad frequency band.

Figure 8:
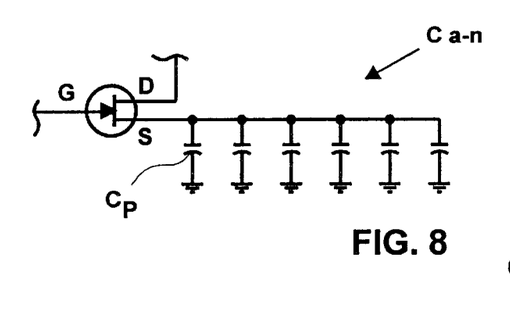
FIG. 8 shows the use of multiple decoupling capacitors to minimize the equivalent series resistance (ESR) of the decoupling capacitors.

Referring now to FIG. 8, two or more multiple porcelain dielectric capacitors $C_P$, each with self-resonant frequencies at or near the amplifier operational frequency, are connected in parallel from the FET source terminal to a circuit ground to achieve the low required decoupling capacitor ESR for high power rf applications.

Paralleling a plurality of capacitors $C_P$ at the self-resonant frequency divides the ESR in the same manner as paralleling resistors. However, if a capacitor $C_P$ is not available with a resonant frequency that closely matches an operating frequency for narrow-band operation, two paralleled capacitors $C_P$ are chosen with one having a resonant frequency above the narrow-band frequency, and the other having a resonant frequency below the narrow-band frequency.

Referring now to FIGS. 1, 2, 4, 10, 11, and 12 preferably, the effective series resistances of the decoupling capacitors C5, C6, C9, and/or C12 each have an effective series resistance of less than 0.4 ohms divided by the rf output power. More preferably, all of these decoupling capacitors C5, C6, C9, and/or C12 have an effective series resistance of 0.20 ohms divided by the rf output power.

If the required ESR, as calculated by either of the formulas given above, for any or all of the decoupling capacitors C5, C6, C9, and/or C12 cannot be met by a single capacitor $C_P$, any or all may be replaced by any number of paralleled capacitors Ca–n, as shown in FIG. 8.

Porcelain capacitors presently have the lowest dielectric resistance and are preferred for minimizing the effective rf impedance. Porcelain capacitors, model 600S, manufactured by American Technical Ceramics of Huntington Station, N.Y., are suitable for rf decoupling as taught herein.

Model 600S capacitors that are available from American Technical Ceramics, their self resonant frequencies, their capacities, and their effective series resistances, are included in the following table.

TABLE 1

Porcelain Capacitors
Self Resonant Frequencies vs. ESRs

| Self Resonant Freq. | Capacitance | ESR |
| --- | --- | --- |
| 1 Ghz | 100 pF | 0.07 ohms |
| 2 Ghz | 40 pF | 0.09 ohms |
| 4 Ghz | 15 pF | 0.15 ohms |
| 8 Ghz | 3 pf | 0.20 ohms |
| 16 Ghz | 1 pf | 0.30 ohms |

Referring now to FIG. 8 and Table 1, as an example of capacitor paralleling to achieve a required ESR, assume an rf output of 5.0 Watts, using the 0.2 ohms/Watts criteria, the ESR of the decoupling capacitor should be 0.04 ohms. Assuming an operating frequency of 4.0 Ghz, from Table 1, the ESR for a porcelain capacitor is 0.15 ohms, so four capacitors must be paralleled to achieve the required ESR.

Packaged FETs typically have a considerable source lead parasitic inductance. By choosing a decoupling capacitor, or capacitors, with a value that resonates with the source lead inductance, the true FET source impedance to a circuit ground is further reduced.

Therefore, the package, or lead, inductance of the capacitor, or capacitors, should be considered in the equation for resonance when selecting a capacitor to resonate with the FET source lead inductance. Additionally, several parallel capacitors with a combined reactance that resonates with the FET source lead inductance are selected to minimize the decoupling capacitor ESR and maximize efficiency in high-power rf applications (FET rf output in excess of 2.0 Watts).

Often in high-power packaged FETs the source terminal is the body of the device and is connected to a mounting flange. Conventionally, the flange is connected directly to a circuit ground with metallic screws to achieve minimal rf impedance to an electrical ground and to maximize thermal conductivity between the FET and a circuit ground, which is most often a chassis serving as a heat sink to the FET. However, in the present invention, the source terminals of the FETs are electrically isolated from a circuit ground.

Figure 9:
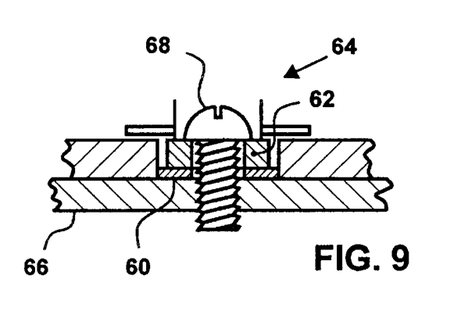
FIG. 9 is a side elevation, in partial cross section, of a high-power rf FET that is mounted to achieve maximum thermal conduction while maintaining electrical isolation of the source-terminal from an electrical ground.

Referring now to FIG. 9, a thermally conductive, electrically insulating pad 60 is inserted between a FET mounting flange 62 of a FET 64 and a heat sink, or chassis, 66 to allow the dissipated heat of the FET 64 to flow from the FET 64 to the heat sink 66 while maintaining electrical isolation. The electrical insulating material of the pad 60 should have no higher than 0.5° C./Watt thermal resistance. An insulating material with a higher thermal resistance, combined with the thermal resistance of the FET 64 and the ambient temperature, may result in the internal junction temperature of the FET 64 being excessive, thereby causing reduced reliability or destruction of the FET 64.

A suitable material for the insulating material is DeltaPad Thermally Conductive Insulator, Part Number 174-9 Series, manufactured by Wakefield Engineering of Pelham, N.H. The material for the insulating pad 60 is 0.22 millimeters (0.009 inches) thick, has a thermal resistance of 0.25° C./W, a resistivity of $10^{13}$ megohms per cubic centimeter of volume, and a 5000 volt breakdown.

The mounting flange 62 is held in heat-conducting contact with the insulating pad 60 and with the heat sink 66, with non-ferrous, or non-conductive, screws 68. The tensile strength and stretching of the screw material along with the manufacturer-recommended FET mounting torque must be taken into account when selecting fasteners.

Figure 10:
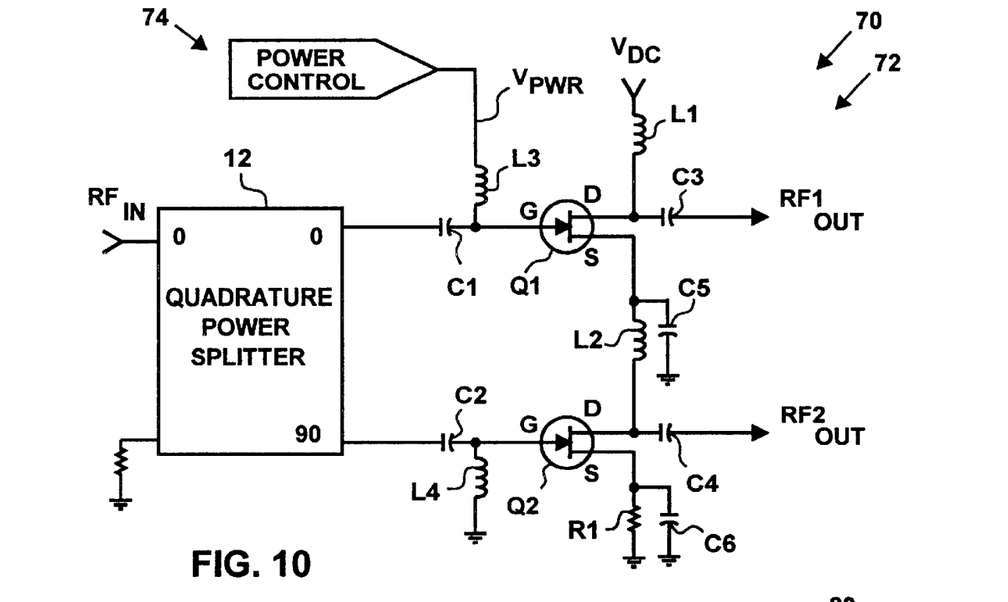
FIG. 10 is a first preferred embodiment of a power-shifting rf amplifier of the present invention in which two solid-state current devices are connected in series between higher and lower dc source-voltages, in which rf signals, which may be in quadrature, are separately amplified in the solid-state current devices, and in which the rf power is selectively shifted and proportioned between two separate rf outputs in response to a single power-shifting voltage.

Referring now to FIG. 10, a power-shifting rf amplifier, or power-switching rf amplifier, 70 includes a splitting rf amplifier 72 and a power control 74. The splitting rf amplifier 72 includes the quadrature power splitter 12, the FETs Q1 and Q2, the coupling capacitors C1, C2, C3, and C4, the decoupling capacitors C5 and C6, the rf chokes L1, L2, L3, and L4, the resistor R1, and rf outputs $RF1_{OUT}$ and $RF2_{OUT}$.

The power-shifting amplifier 70 proportions its rf output between the rf outputs $RF1_{OUT}$ and $RF2_{OUT}$, or shifts the total rf output between the rf outputs $RF1_{OUT}$ and $RF2_{OUT}$, in response to a power-shifting voltage $V_{PWR}$, and in accordance with both a magnitude of the power-shifting voltage $V_{PWR}$ and a rate of change thereof. The power-shifting voltage $V_{PWR}$ is generated, or supplied, by the power control 74. The power-shifting voltage $V_{PWR}$, as applied to the gate terminal of the FET Q1, is effective to control gains of both FETs Q1 and Q2 as described in conjunction with FIG. 1.

By varying the power-shifting voltage $V_{PWR}$ both rapidly and with a sufficient change in voltage, the rf output power can be switched almost instantaneously from one of the rf outputs, $RF1_{OUT}$ or $RF2_{OUT}$ to the other one of the rf outputs, $RF2_{OUT}$ or $RF1_{OUT}$.

Both the phase control 16 of FIG. 1 and the power control 74 of FIG. 10 represent any means for providing selectively-variable gate voltages. While the phase control 16 and the power control 74 vary in function, they do not necessarily vary in construction. That is, the phase control 16 provides a phase-shifting voltage for controlling a phase angle of an rf output $RF_{OUT}$ of FIG. 1, whereas the power control 74 of FIG. 10 provides a power-shifting voltage for selectively and progressively shifting rf output power from the rf output $RF1_{OUT}$ to the rf output $RF2_{OUT}$.

Even as the phase-shifting rf amplifier 10 of FIG. 1 maintains substantially constant rf power during phase shifting, the power-shifting rf amplifier 70 of FIG. 10 maintains a total rf output of the two rf outputs, $RF1_{OUT}$ and $RF2_{OUT}$, substantially constant whether the rf output is progressively shifted or switched almost instantaneously.

Figure 15:
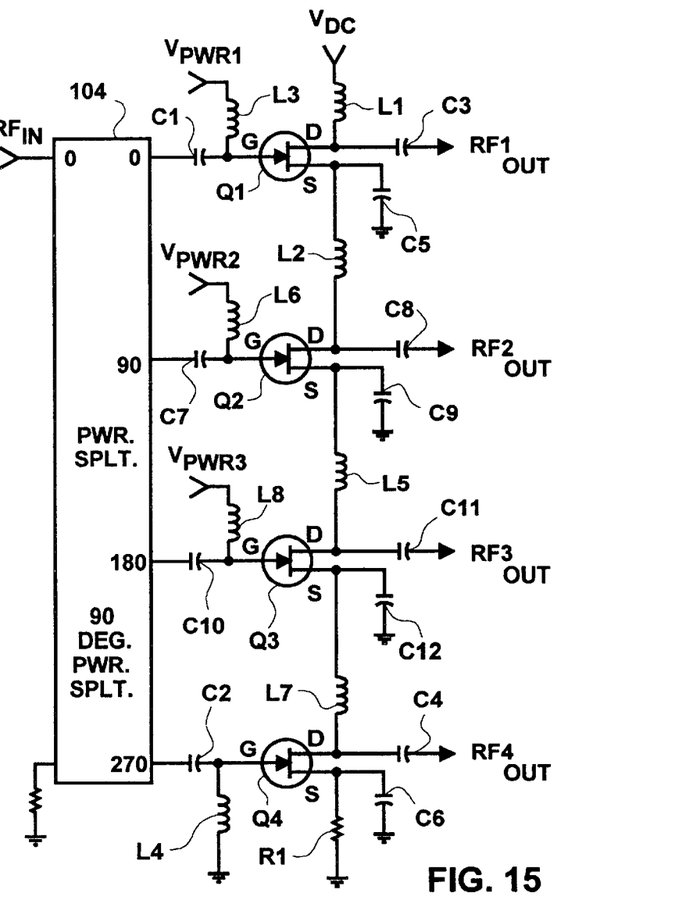
FIG. 15 is a fourth preferred embodiment of a power-shifting rf amplifier of the present invention, that also includes the power control of FIG. 14, and that differs from the power-shifting rf amplifier of FIG. 13 in that a single splitter is used to produce four phase-shifted rf outputs.

Since the rf input signal, $RF_{IN}$, has been split by the quadrature power splitter 12, quadrature rf signals are supplied to the gate terminals of the FETs Q1 and Q2, and the rf outputs $RF1_{OUT}$ and $RF2_{OUT}$ are in quadrature. But, if an in-phase splitter, similar to that shown in FIG. 15, is substituted for the quadrature splitter 12, the two rf outputs $RF1_{OUT}$ and $RF2_{OUT}$ will be in phase.

Figure 11:
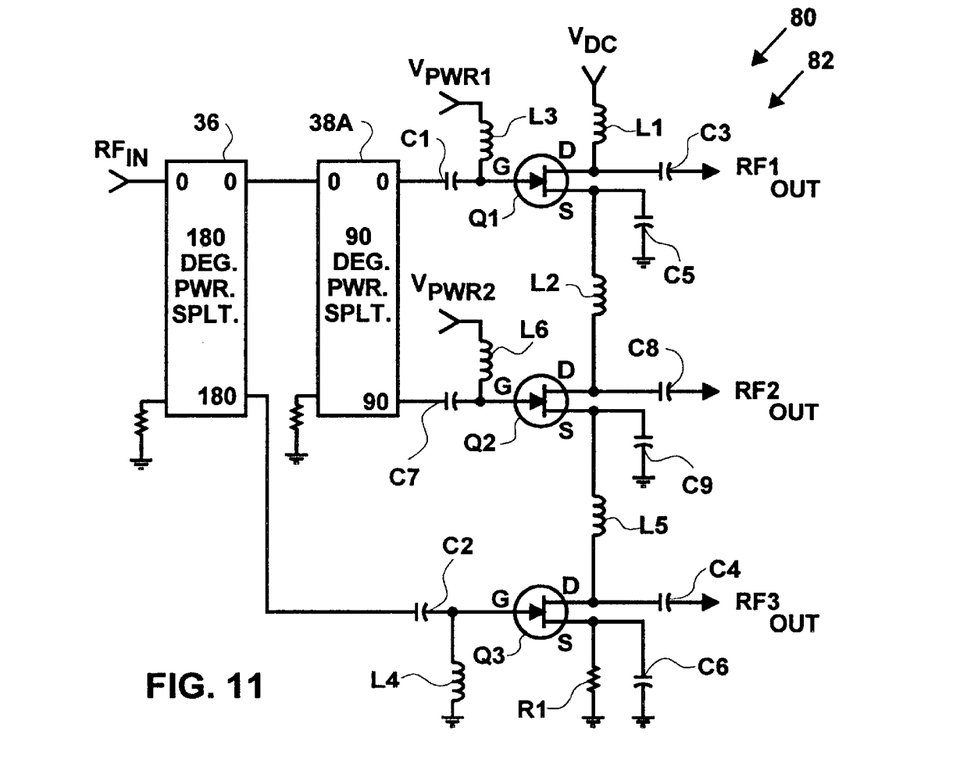
FIG. 11 is a second preferred embodiment of a power-shifting rf amplifier of the present invention in which three solid-state current devices are connected in series between higher and lower dc source-voltages, in which 0, 90, and 180 degree rf signals are separately amplified in the three solid-state current devices, and in which the rf power is selectively shifted/proportioned among three rf outputs in response to two power-shifting voltages that are provided by a power control of FIG. 12.
Figure 12:
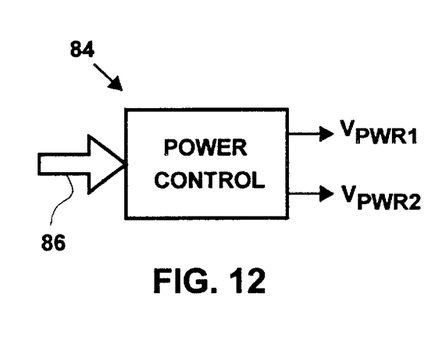
FIG. 12 is a power control that is a part of the power-shifting rf amplifier of FIG. 11, and that generates two power-shifting voltages in response to an analog or digital input.

Referring now to FIGS. 11 and 12, a variable power-shifting rf amplifier, or power-switching amplifier, 80 includes both a splitting rf amplifier 82 of FIG. 11 and a power control 84 of FIG. 12. In addition to components named and numbered in conjunction with FIG. 10, the splitting rf amplifier 82 includes the 180 degree splitter 36, the 90 degree splitter 38A, the FET Q3, the capacitors C7, C8, and C9, and the rf chokes L5 and L6 of FIG. 2.

The variable power-shifting rf amplifier 80 produces three rf outputs, $RF1_{OUT}$, $RF2_{OUT}$, and $RF3_{OUT}$. The power-shifting rf amplifier 80 will selectively shift, or abruptly switch, power between/among the rf power outputs $RF1_{OUT}$, $RF2_{OUT}$, and $RF3_{OUT}$ in response to power-shifting voltages $V_{PWR1}$ and $V_{PWR2}$.

The power control 84 produces the power-shifting voltages $V_{PWR1}$, $V_{PWR2}$, and $V_{PWR3}$ in response to an analog or digital input 86. As can be understood by considering the discussion of FIG. 2, the rf output $RF2_{OUT}$ is at 90.0 degrees to the rf output $RF1_{OUT}$, and the rf output $RF3_{OUT}$ is at 180 degrees to the rf output $RF1_{OUT}$.

The power control 84 is representative of any device that will produce the power-shifting voltages $V_{PWR1}$ and $V_{PWR2}$ in response to the analog or digital input 86, vary them in whatever manner is useful for a particular application, and vary them in whatever time frame may be desirable or suitable for an intended use of the power-shifting rf amplifier 80.

In the phase-shifting rf amplifier 30 of FIG. 2, gains of the FETs Q1, Q2, and Q3 are selectively varied by varying the phase-shifting voltages $V_{PS1}$ and $V_{PS2}$ to the gates of the FETs Q1 and Q2, and the rf output $RF_{OUT}$ is phase shifted.

In like manner, in the power-shifting rf amplifier 80 of FIG. 11, gains of the FETs Q1, Q2, and Q3 are selectively varied by varying voltages applied to gates of the FETs Q1 and Q2. However, in the power-shifting rf amplifier 80 of FIG. 11, the gate voltages are called power-shifting voltages $V_{PWR1}$ and $V_{PWR2}$, because these voltages selectively shift, or switch, the rf output among rf outputs $RF1_{OUT}$, $RF2_{OUT}$, and $RF3_{OUT}$.

Figure 13:
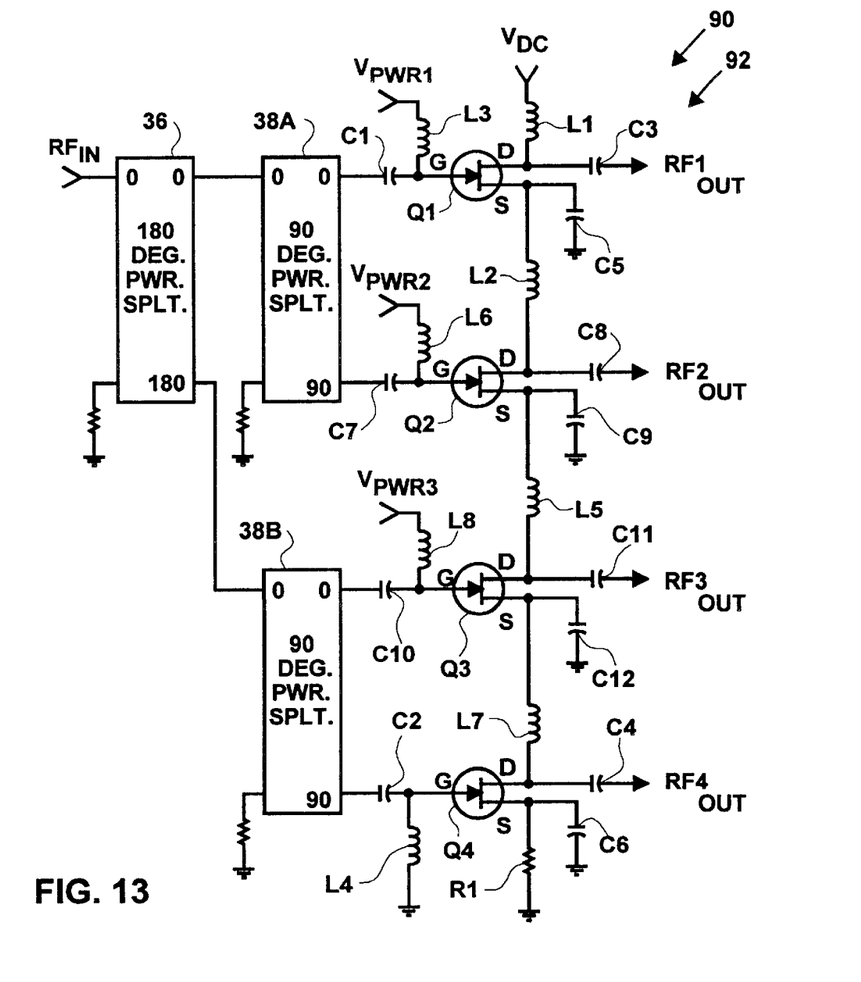
FIG. 13 is a third preferred embodiment of a power-shifting rf amplifier of the present invention in which four solid-state current devices are connected in series between higher and lower dc source-voltages, in which 0, 90, 180, and 270 degree rf signals are separately amplified in the four solid-state current devices, and in which the rf power among four rf outputs is selectively proportioned among four rf outputs by three power-shifting voltages that are generated by a power-control of FIG. 14.
Figure 14:
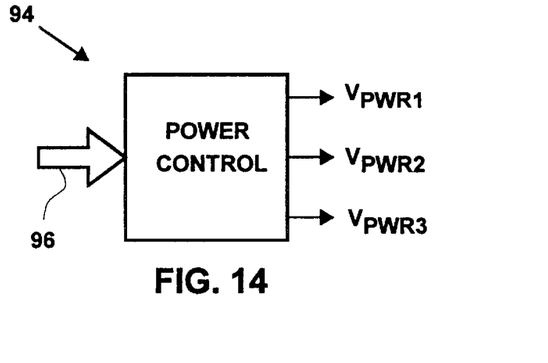
FIG. 14 is a power control that is a part of the power-shifting rf amplifier of FIG. 13, and that generates three power-shifting voltages in response to an analog or digital input.

Referring now to FIGS. 13 and 14, a variable power-shifting rf amplifier, or power-switching amplifier, 90 includes both a splitting rf amplifier 92 of FIG. 13 and a power control 94 of FIG. 14. In addition to components named and numbered in conjunction with FIG. 11, the splitting rf amplifier 92 of FIG. 13 includes the 90 degree splitter 38B, the FET Q4, capacitors C10, C11, and C12, and rf chokes L7 and L8.

The variable power-shifting rf amplifier 90 has four rf outputs, $RF1_{OUT}$, $RF2_{OUT}$, $RF3_{OUT}$, and $RF4_{OUT}$. The power-shifting rf amplifier 90 will selectively and progressively shift, or abruptly switch, power between/among the rf power outputs $RF1_{OUT}$, $RF2_{OUT}$, $RF3_{OUT}$, and $RF4_{OUT}$ in response to power-shifting voltages $V_{PWR1}$, $V_{PWR2}$, and $V_{PWR3}$.

The power control 94 produces the power-shifting voltages $V_{PWR1}$, $V_{PWR2}$, and $V_{PWR3}$ in response to an analog or digital input 96. The rf output $RF2_{OUT}$ is at 90.0 degrees to the rf output $RF1_{OUT}$, the rf output $RF3_{OUT}$ is at 180 degrees to the rf output $RF1_{OUT}$, and the rf output $RF4_{OUT}$ is at 270 degrees to the rf output $RF1_{OUT}$.

The phase control 94 is representative of any device that will produce the power-shifting voltages $V_{PWR1}$, $V_{PWR2}$, and $V_{PWR3}$ in response to the analog or digital input 96, vary them in whatever manner is useful for a particular application, and vary them in whatever time frame may be desirable or suitable for an intended use of the power-shifting rf amplifier 90.

Gains of the FETs Q1, Q2, Q3, and Q4 are selectively varied by varying the power-shifting voltages $V_{PWR1}$, $V_{PWR2}$, and $V_{PWR3}$ to the gates of the FETs Q1 Q2, and Q3. As the power-shifting voltages $V_{PWR1}$, $V_{PWR2}$, and $V_{PWR3}$ are selectively varied, the rf output is selectively shifted/proportioned among rf outputs $RF1_{OUT}$, $RF2_{OUT}$, $RF3_{OUT}$, and $RF4_{OUT}$.

Referring now to FIGS. 15 and 14, a variable power-shifting rf amplifier, or power-switching amplifier, 100 includes both a splitting rf amplifier 102 of FIG. 15 and the power control 94 of FIG. 14. Instead of the power splitters 36, 38A, and 38B of FIG. 13, the splitting rf amplifier 102 includes an in-phase rf power splitter 104 that produces four, in-phase rf signals.

As with the variable power-shifting rf amplifier 90 of FIG. 13, the variable power-shifting rf amplifier 100 of FIG. 15 produces four rf outputs, $RF1_{OUT}$, $RF2_{OUT}$, $RF3_{OUT}$, and $RF4_{OUT}$. The power-shifting rf amplifier 100 will selectively shift, or abruptly switch, power between/among the rf power outputs $RF1_{OUT}$, $RF2_{OUT}$, $RF3_{OUT}$, and $RF4_{OUT}$ in response to power-shifting voltages $V_{PWR1}$, $V_{PWR2}$, and $V_{PWR3}$ that are generated by the power control 94 in response to the analog or digital input 96 of FIG. 14.

Figure 16:
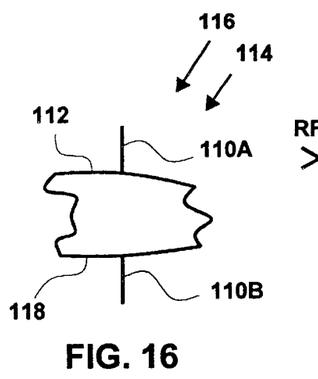
FIG. 16 is a partial elevation of a fuselage of an airplane showing top-mounted and belly-mounted antennas for connection to rf outputs of the power-shifting rf amplifiers of the present invention.

Referring now to FIG. 16 an antenna, or stub, 110A is mounted to a top 112 of a fuselage 114 of an airplane 116; and an antenna, or stub, 110B is mounted to a belly 118 of the fuselage 114. By attaching the rf outputs $RF1_{OUT}$ and $RF2_{OUT}$ of the power-shifting rf amplifier 70 to respective ones of the antennas, 110A and 110B, rf power may be selectively shifted, or switched, between the antennas 110A and 110B to maintain optimum ground link.

Figure 17:
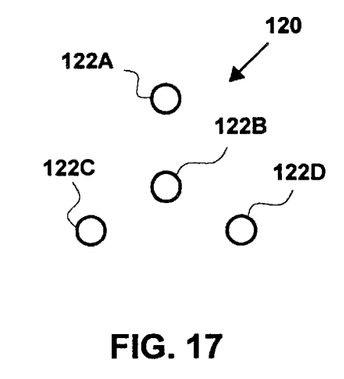
FIG. 17 is a top view of an antenna array that may be used with the power-shifting rf amplifiers of FIGS. 13 and 15.

Referring now to FIG. 17, an antenna array 120 includes antennas 122A, 122B, 122C, and 122D. By attaching one of the rf outputs, $RF1_{OUT}$, $RF2_{OUT}$, $RF3_{OUT}$, and $RF4_{OUT}$ of the power-shifting rf amplifier 100 to each of the antennas, 122A, 122B, 122C, and 122D, and then selectively shifting the rf outputs of $RF1_{OUT}$, $RF2_{OUT}$, $RF3_{OUT}$, and $RF4_{OUT}$, a radiation pattern, not shown, can be selectively adjusted. Alternately, if the power-shifting rf amplifier 90 is used, phase angles of the rf outputs $RF1_{OUT}$, $RF2_{OUT}$, $RF3_{OUT}$, and $RF4_{OUT}$ can be applied to selective ones of the antennas 122A, 122B, 122C, and 122D to generate a variety of additional, new, and useful radiation patterns.

The ability of the power-shifting rf amplifiers 70, 80, 90, and 100 to variably and progressively shift power from one rf output to another, and optionally to selectively switch rf power from one rf output to another, has various applications.

For instance, the present invention provides a solid-state switch for directing rf power from one rf power amplifier to another, thereby providing for hot-switching of rf power from one rf power amplifier to another when one rf power amplifier malfunctions.

As taught in conjunction with FIG. 16, the present invention may be used to variably shift rf output between/among antennas mounted on an airplane, to maintain optimal ground link.

As taught in conjunction with FIG. 17, the present invention may be used in antenna arrays, using selectively variable rf power to a plurality of rf outputs, such as the rf outputs $RF1_{OUT}$, $RF2_{OUT}$, $RF3_{OUT}$, and $RF4_{OUT}$ of FIGS. 13 and 15, to provide new and useful radiation patterns with, or without the additional variation provided by the quadrature rf outputs of the variable power-shifting rf amplifier 90 of FIG. 13.

While the preceding discussion has focused on the use of FETs, bipolar silicon transistors, and other solid-state amplifying devices may be used. However, FETs are preferred because of their high gain, thereby reducing the total number of amplification stages that are required to achieve the desired rf power output. Therefore, it should be understood that the principles taught herein may be applied to other types of solid-state amplifying devices.

In summary, the present invention can be characterized as phase splitting an rf input into a plurality of rf signals that are at either in phase or that are at different phase angles, selectively amplifying selected ones of the rf signals, producing a plurality of rf outputs that are either in phase or in quadrature, and that are at different rf power levels, and progressive shifting, or rapidly switching, rf power between/among the rf outputs.

The present invention can be characterized as applying a dc voltage across two or more FETs that are connected in series, and selectively utilizing all of the dc voltage in one of the FETs, or dividing the dc voltage between/among the FETs.

The present invention can be characterized as power-shifting rf outputs between/among a plurality of rf outputs without a total rf output decreasing to zero, or even changing appreciably.

Finally, the present invention can be characterized as providing optimum rf decoupling, especially by reducing the effective series resistance (ESR) of decoupling capacitors, thereby removing power limitations from rf power amplifiers in which solid-state amplifying devices, such as FETs, are connected in series between a source-voltage and a lower-voltage.

While specific apparatus and method have been disclosed in the preceding description, it should be understood that these specifics have been given for the purpose of disclosing the principles of the present invention, and that many variations thereof will become apparent to those who are versed in the art. Therefore, the scope of the present invention is to be determined by claims included herein without any limitation by numbers that may be parenthetically inserted in the claims.

What is claimed is:

1. A method for selectively proportioning rf power to a plurality of rf outputs which comprises:
    a) splitting a single rf signal into a plurality of split rf signals;
    b) separately power amplifying said split rf signals into said plurality of rf outputs;
    c) selectively proportioning gains of said separate power amplifying steps; and
    d) maintaining a summation of said gains substantially constant.

2. A method as claimed in claim 1 in which:
    a) said splitting step comprises in-phase splitting; and
    b) said plurality of rf outputs are in phase.

3. A method as claimed in claim 1 in which:
    a) said splitting step comprises quadrature splitting; and
    b) two of said rf outputs are in quadrature.

4. A method as claimed in claim 1 in which:
    a) said splitting step comprises 180 degree splitting; and
    b) two of said rf outputs are at 180 degrees to each other.

5. A method as claimed in claim 1 in which:
    a) said selective proportioning step comprises switching all of said rf power to one of said rf outputs; and
    b) said maintaining step comprises maintaining said rf power substantially constant during said switching step.

6. A method for selectively proportioning rf power to a plurality of rf outputs which comprises:
    a) series connecting a plurality of solid-state amplifying devices between a dc source-voltage and a lower dc voltage;
    b) splitting an rf input signal into a plurality of split rf signals;
    c) separately power amplifying said split rf signals in said series-connected solid-state amplifying devices into a plurality of rf outputs;
    d) selectively proportioning gains of said separate power amplifying steps to be different, one from an other; and
    e) maintaining a total rf power substantially constant during said selective proportioning step.

7. A method as claimed in claim 6 in which:
    a) said splitting step comprises in-phase splitting; and
    b) said plurality of rf outputs are in phase.

8. A method as claimed in claim 6 in which:
    a) said splitting step comprises quadrature splitting; and
    b) two of said rf outputs are in quadrature.

9. A method as claimed in claim 6 in which:
    a) said splitting step comprises 180 degree splitting; and
    b) two of said rf outputs are at 180 degrees to each other.

10. A method as claimed in claim 6 in which said selective proportioning step comprises switching all of said total rf power to one of said rf outputs.

11. A method as claimed in claim 6 in which:
    a) said plurality of solid-state amplifying devices comprise a plurality of field-effect transistors each having a gate; and
    b) said selective proportioning of gains comprises selective adjustment of a voltage to one of said gates.

12. A method as claimed in claim 6 in which said method further comprises:
   a) rf decoupling an adjacent pair of said series-connected solid-state amplifying devices from each other; and
   b) said rf decoupling step comprises connecting capacitors in parallel between said adjacent pair of series-connected solid-state amplifying devices and an electrical ground.

13. A method for selectively proportioning rf power to a plurality of antennas on an airplane, which method comprises:
   a) splitting a single rf signal into a plurality of split rf signals;
   b) separately power amplifying said split rf signals into a plurality of rf outputs;
   c) separately connecting said rf power outputs to respective ones of said antennas;
   d) selectively proportioning gains of said separate power amplifying steps to be different, one from another; and
   e) maintaining rf power substantially constant during said selective proportioning step.

14. A method as claimed in claim 13 in which:
   a) said splitting step comprises out-of-phase splitting; and
   b) said method further comprises supplying said rf power to two of said antennas at different phase angles.

15. A method as claimed in claim 13 in which said selective proportioning step comprises:
   a) switching said rf power from one of said antennas to the other of said antennas; and
   b) maintaining said rf power substantially constant during said switching step.

16. A method as claimed in claim 13 in which said method further comprises:
   a) top-mounting one of said antennas onto a fuselage of said airplane; and
   b) belly-mounting the other of said antennas onto said fuselage.

17. A method for selectively proportioning rf power among an array of antennas, which method comprises:
   a) splitting a single rf signal into a plurality of split rf signals;
   b) separately power amplifying said split rf signals into a plurality of rf power outputs;
   c) separately connecting said rf outputs to said antennas;
   d) selectively proportioning gains of said separate power amplifying steps to be different, one from an other; and
   e) maintaining said rf power substantially constant during said selective proportioning step.

18. A method as claimed in claim 17 in which: an array of antennas, which method comprises:
   a) said splitting step comprises out-of-phase splitting; and
   b) said separate connecting step comprises supplying said rf power outputs to two of said antennas at different phase angles.

19. A method as claimed in claim 1 in which said selective proportioning of gains comprises inversely proportioning two of said gains.

20. A method as claimed in claim 1 in which said selective proportioning of gains comprises selectively proportioning said gains in response to a single, variable, power-shifting voltage.

21. A method as claimed in claim 6 in which said method further comprises:
   a) rf decoupling an adjacent pair of said series-connected solid-state amplifying devices from each other;
   b) said rf decoupling step comprises providing a capacitance between said adjacent pair of series-connected solid-state amplifying devices and an electrical ground; and
   c) said providing step comprises making an rf effective series resistance of said capacitance lower than that of any porcelain capacitor of said capacitance.

22. A method as claimed in claim 6 in which said selective proportioning of gains comprises inversely proportioning two of said gains.

23. A method as claimed in claim 6 in which said selective proportioning of gains comprises individual ones of said solid-state amplifying devices utilizing a difference in voltages between said dc source-voltage and said lower dc voltage in various selected proportions.

24. A method as claimed in claim 6 in which said selective proportioning of gains comprises selectively proportioning said gains in response to a single, variable, power-shifting voltage.

25. A method as claimed in claim 13 in which:
   a) said separate power amplifying steps comprise connecting a plurality of solid-state amplifying devices in series between a dc source-voltage and a lower dc voltage; and
   b) said selective proportioning step comprises utilizing a difference in said dc voltages in individual ones of said solid-state amplifying devices in various percentages.

26. A method as claimed in claim 13 in which:
   a) said separate power amplifying steps comprise connecting a plurality of solid-state amplifying devices in series between a dc source-voltage and a lower dc voltage;
   b) said selective proportioning step comprises utilizing a difference in said dc voltages in individual ones of said solid-state amplifying devices in various percentages; and
   c) said utilizing step comprises utilizing said difference in said various percentages in response to a single, variable, power-shifting voltage.

27. A method as claimed in claim 17 in which:
   a) said separate power amplifying steps comprise connecting a plurality of solid-state amplifying devices in series between a dc source-voltage and a lower dc voltage; and
   b) said selective proportioning step comprises utilizing a difference in said dc voltages in individual ones of said solid-state amplifying devices in various percentages.

28. A method as claimed in claim 17 in which:
   a) said separate power amplifying steps comprise connecting a plurality of solid-state amplifying devices in series between a dc source-voltage and a lower dc voltage;
   b) said selective proportioning step comprises utilizing a difference in said dc voltages in individual ones of said solid-state amplifying devices in various percentages; and
   c) said utilizing step comprises utilizing said difference in said various percentages in response to a single, variable, power-shifting voltage.

29. A method which comprises:
   a) series connecting a plurality of solid-state amplifying devices between a dc source-voltage and a lower dc voltage;
   b) separately power amplifying a plurality of rf signals in respective ones of said solid-state amplifying devices; and
   c) said power amplifying step comprises utilizing any selected percentage, of a difference between said dc source-voltage and said lower dc voltage, in any selected one of said solid-state amplifying devices.

30. A method as claimed in claim 29 in which said selective utilizing step comprises controlling said different percentages in response to variations in a single, variable, power-shifting voltage.

31. A method as claimed in claim 29 in which said method further comprises:
   a) rf decoupling an adjacent pair of said series-connected solid-state amplifying devices from each other; and
   b) said rf decoupling step comprises connecting capacitors in parallel between said adjacent pair of series-connected solid-state amplifying devices and an electrical ground.

32. A method which comprises:
   a) series connecting a plurality of solid-state amplifying devices between a dc source-voltage and a lower dc voltage;
   b) separately power amplifying a plurality of rf signals in respective ones of said solid-state amplifying devices at a selected operating frequency;
   c) said power amplifying step comprises utilizing any selected percentage, of a difference between said dc source-voltage and said lower dc voltage, in any selected one of said solid-state amplifying devices;
   d) rf decoupling an adjacent pair of said series-connected solid-state amplifying devices;
   e) said rf decoupling step comprises providing a capacitance between said adjacent pair of series-connected solid-state amplifying devices and an electrical ground; and
   f) said providing step comprises making an rf effective series resistance of said capacitance lower than any porcelain capacitor that operates at said selected operating frequency.

33. A method as claimed in claim 32 in which said step of making said rf effective series resistance lower than any porcelain capacitor comprises paralleling capacitors.

34. A method which comprises:
   a) series connecting upper and lower solid-state amplifying devices between a dc source-voltage and a lower dc voltage;
   b) said series-connecting step comprises connecting a lower-voltage terminal of said upper solid-state amplifying device to an rf choke, and connecting said rf choke to a higher-voltage terminal of said lower solid-state amplifying device;
   c) separately power amplifying a pair of rf signals in respective ones of said solid-state amplifying devices at a selected operating frequency;
   d) said power amplifying step comprises utilizing any selected percentage, of a difference between said dc source-voltage and said lower dc voltage, in any selected one of said solid-state amplifying devices;
   e) rf decoupling said solid-state amplifying devices; and
   f) said rf decoupling step comprises providing a capacitance between said lower-voltage terminal and an electrical ground whose rf effective series resistance is lower than any porcelain capacitor at said selected operating frequency.

35. A method as claimed in claim 34 in which step of making said rf effective series resistance lower than any porcelain capacitor comprises paralleling capacitors.

36. A method which comprises:
   a) series connecting upper and lower solid-state amplifying devices between a dc source-voltage and a lower dc voltage;
   b) said series-connecting step comprises connecting a lower-voltage terminal of said upper solid-state amplifying device to an rf choke, and connecting said rf choke to a higher-voltage terminal of said lower solid-state amplifying device;
   c) separately power amplifying a pair of rf signals in respective ones of said solid-state amplifying devices at a selected operating frequency; and
   d) said power amplifying step comprises utilizing any selected percentage, of a difference between said dc source-voltage and said lower dc voltage, in any selected one of said solid-state amplifying devices.

37. A method as claimed in claim 29 in which:
   a) said method further comprises splitting a single rf signal into said plurality of rf signals prior to said separate power amplifying step;
   b) said splitting step comprises in-phase splitting; and
   c) two of said separately power amplified rf signals are in phase.

38. A method as claimed in claim 29 in which:
   a) said method further comprises splitting a single rf signal into said plurality of rf signals prior to said separate power amplifying step;
   b) said splitting step comprises quadrature splitting; and
   c) two of said separately amplified rf signals are in quadrature.

39. A method as claimed in claim 29 in which:
   a) said method further comprises splitting a single rf signal into said pluraiity of rf signals prior to said separate power amplifying step;
   b) said splitting step comprises 180 degree splitting; and
   c) two of said separately amplified rf signals are 180 degrees to each other.

40. A method as claimed in claim 29 in which said utilizing step comprises switching two of said separately amplifying rf signals to a single rf output.

41. A method as claimed in claim 29 in which:
   a) said plurality of solid-state amplifying devices comprise a plurality of field-effect transistors, each having a gate; and
   b) said utilizing step comprises selective adjustment of a voltage to one of said gates.

42. A method as claimed in claim 29 in which said method further comprises:
   a) rf decoupling an adjacent pair of said series-connected solid-state amplifying devices from each other;
   b) said rf decoupling step comprises providing a capacitance between said adjacent pair of series-connected solid-state amplifying devices and an electrical ground; and
   c) said providing step comprises making an rf effective series resistance of said capacitance lower than that of any capacitor that operates at a selected operating frequency of said power amplifying step.

43. A method as claimed in claim 29 in which said utilizing step comprises inversely proportioning said selected percentages of two of said solid-state amplifying devices.

44. A method as claimed in claim 29 in which:
   a) said utilizing step comprises selectively controlling gains of individual ones of said solid-state amplifying devices; and
   b) said selective controlling step comprises selectively controlling said gains in response to variations in a single, variable, power-shifting voltage.

* * * * *